United States Patent
Ting et al.

(10) Patent No.: US 11,579,195 B2
(45) Date of Patent: Feb. 14, 2023

(54) AUTOMATED VERIFICATION CODE GENERATION BASED ON A HARDWARE DESIGN AND DESIGN DATA

(71) Applicant: Micron Technology, Inc., Boise, ID (US)

(72) Inventors: Benjamin Ting, Cupertino, CA (US); Alon Shtepel, Pleasanton, CA (US); Isaac Kim, San Jose, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 732 days.

(21) Appl. No.: 16/534,348

(22) Filed: Aug. 7, 2019

(65) Prior Publication Data

US 2020/0158781 A1 May 21, 2020

Related U.S. Application Data (60) Provisional application No. 62/769,839, filed on Nov. 20, 2018.

(51) Int. Cl.
  *G01R 31/319* (2006.01)
  *G06F 30/33* (2020.01)
  *G06F 13/16* (2006.01)
  *G06F 12/14* (2006.01)

(52) U.S. Cl.
  CPC . *G01R 31/31907* (2013.01); *G01R 31/31912* (2013.01); *G06F 12/1433* (2013.01); *G06F 13/1668* (2013.01); *G06F 30/33* (2020.01)

(58) Field of Classification Search
  CPC .. G06F 30/33; G06F 12/1433; G06F 13/1668; G01R 31/31907; G01R 31/31912
  See application file for complete search history.

(56) References Cited

U.S. PATENT DOCUMENTS

| | | | | |
|---|---|---|---|---|
| 5,724,504 A | * | 3/1998 | Aharon | G06F 30/33 714/33 |
| 6,487,704 B1 | * | 11/2002 | McNamara | G01R 31/318314 714/E11.167 |
| 8,904,321 B1 | * | 12/2014 | Cohen | G06F 30/20 716/112 |
| 9,158,874 B1 | * | 10/2015 | Ranjan | G06F 30/33 |
| 9,582,620 B1 | * | 2/2017 | Segal | G06F 11/3457 |
| 10,515,169 B1 | * | 12/2019 | Spatafore | G06F 30/3323 |
| 2003/0018945 A1 | * | 1/2003 | Foster | G06F 30/33 716/106 |
| 2006/0229860 A1 | * | 10/2006 | Azatchi | G06F 30/20 703/14 |

(Continued)

*Primary Examiner* — Charles Rones
*Assistant Examiner* — Hewy H Li
(74) *Attorney, Agent, or Firm* — Nicholson De Vos Webster & Elliott LLP (57) ABSTRACT

A method for performing verification and testing of a device under test (DUT) is described. The method includes receiving, by a processing device, inputs from a user regarding a hardware design for the DUT. The processing device presents cover group attribute suggestions to the user based on the hardware design and receives cover group information from the user corresponding to one or more cover group attributes of one or more cover groups based on the cover group attribute suggestions. Based on the cover group information, the processing device automatically generates verification code, including one or more cover group definitions.

15 Claims, 10 Drawing Sheets

(56) References Cited

U.S. PATENT DOCUMENTS

2009/0037858 A1\* 2/2009 Thakur ................. G06F 30/398
    716/106
2013/0117722 A1\* 5/2013 Biswas ............... G06F 11/3676
    716/107

\* cited by examiner

COVERGROUP FORM

NAME 502A

| I |
|---|
| SUGGESTED_NAME_1 |
| SUGGESTED_NAME_2 |
| SUGGESTED_NAME_3 |
| SUGGESTED_NAME_4 |
| SUGGESTED_NAME_5 |

TYPE ▼

SAMPLING EVENT

602A

COMMENT

COVERPOINTS — ADD COVERPOINT

COVERPOINTS

LABEL   NAME   BINNING CONDITION

BINS  ADD BIN

TYPE   NAME   RANGE

BIN 1:

CROSSES — ADD CROSS

SUBMIT

FIG. 6

```
COVERGROUP CG_1;
        OPTION,AUTO_BIN-MAX = 1024;
        OPTION.COMMENT = "A FIRST COMMENT";

CP1: COVERPOINT COV_H.CP1 {
                BINS LOW = { 1, 2, 3 };
                BINS HIGH = {16'H1, 16'H2, 16'H4, 16'H8, 16'H10, 16'H20,
                             16'H40, 16'H40, 16'H80, 16'H100, 16'H200,
                             16'H400, 16'H800, 16'H1000, 16'H2000,
                             16'H4000, 16'H8000};
        }
ENGGROUP : CG_1
```
↙ 700

FIG. 10

AUTOMATED VERIFICATION CODE GENERATION BASED ON A HARDWARE DESIGN AND DESIGN DATA

CROSS-REFERENCE TO RELATED APPLICATION

The present application claims the benefit of U.S. Provisional Patent Application No. 62/769,839 filed on Nov. 20, 2018, which is hereby incorporated by reference.

TECHNICAL FIELD

The present disclosure generally relates to automated verification code generation, and more specifically, relates to automated verification code generation based on a hardware design and design data.

BACKGROUND ART

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory subsystem to store data at the memory components and to retrieve data from the memory components. Verification procedures are often performed to ensure the memory subsystem is operating correctly.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to a verification/testing system for a memory subsystem or any other type of system including an application specific integrated circuit (ASIC). A memory subsystem is also hereinafter referred to as a "memory device." An example of a memory subsystem is a memory module that is connected to a central processing unit (CPU) via a memory bus. Examples of memory modules include a dual in-line memory module (DIMM), a small outline DIMM (SO-DIMM), a non-volatile dual in-line memory module (NVDIMM), etc. Another example of a memory subsystem is a storage device that is connected to the central processing unit (CPU) via a peripheral interconnect (e.g., an input/output bus, a storage area network, etc.). Examples of storage devices include a solid-state drive (SSD), a flash drive, a universal serial bus (USB) flash drive, and a hard disk drive (HDD). In some embodiments, the memory subsystem is a hybrid memory/storage subsystem. In general, a host system can utilize a memory subsystem that includes one or more memory components. The host system can provide data to be stored at the memory subsystem and can request data to be retrieved from the memory subsystem.

Designing ASICs, including those used for memory subsystems, is an iterative process that involves defining a set of requirements for the ASIC, implementing those requirements through the production of a hardware design (e.g., RTL), and verifying that the implementation meets the original requirements. In hardware verification languages, sufficient verification coverage can be established through the definition of one or more data structures. Coverage is used to determine when the device under test (DUT) (e.g., the ASIC) has been exposed to a sufficient variety of stimuli such that there is a high confidence that the DUT is functioning as intended. For example, in SystemVerilog, which is a standardized hardware description and hardware verification language used to model, design, simulate, test, and implement electronic systems, including ASICs, cover group data structures can be defined to assist in ensuring verification of components of the DUT are sufficiently covered.

Although SystemVerilog and cover groups provide a solution for verification of a DUT, these systems on their own suffer from several drawbacks. In particular, although standardization efforts for SystemVerilog provide a uniform system for defining cover groups, the specification defining cover groups is complex/nuanced and it is consequentially difficult for verification engineers to ensure that a definition of a cover group complies with all facets of the specification and will subsequently compile. Accordingly, as noted above, verification engineers can require multiple iterations of verification code development to ensure that cover groups of a verification plan for a DUT are correctly coded. Additionally, a set of engineers may intend for a cover group to cover a particular set of elements/points (e.g., cover points, crosses, etc.). However, the complexity involved in manually implementing cover groups can result in that intent not being captured in a cover group. For example, typographical errors while coding cover groups or errors in transposing determined/selected stimuli (e.g., bin ranges) will result in intended verification points not being covered during verification/testing of the DUT. Even when a cover group is properly defined (i.e., complies with a specification and includes intended verification points), it is difficult to later determine the purpose of any particular cover group (e.g., the module, requirement, feature, or sub-feature to which that cover group corresponds) as there is no inherent linkage between cover groups and portions of the DUT. The above cover group definition and management issues are amplified with the definition of a large number of cover groups. In particular, ensuring that every cover group in a large set of cover groups (e.g., hundreds or thousands of cover groups) compiles and captures the intended verification points while manually mapping each cover group to a module in the DUT, a requirement for the module, a feature to fulfill the requirement, a sub-feature to fulfill the feature, etc., is difficult and prone to error. Errors can result in inadequate verification/testing and latent defects in the DUT.

Aspects of the present disclosure address the above and other deficiencies by providing an automated system for generation of verification code representing cover groups in response to and based on a set of requirements for a module of a DUT, a set of features to fulfill each requirement in the set of requirements, and/or a set of sub-features to fulfill the set of features. For example, through a graphical user interface provided by a verification system, a verification engineer can input cover group attributes, including a cover group name, a cover group type, a sampling event, a block, a bin max, and/or a comment, for a new cover group. Based on these entered cover group attributes, the verification system automatically generates verification code (e.g., SystemVerilog code) representing the new cover group. In particular, the verification system automatically generates verification code representing a new cover group with the cover group attributes added to corresponding portions of the verification code. Accordingly, the verification code accurately represents the intent of the verification engineer for the cover group, as typographical and transposition errors are avoided. Further, the automatic generation of verification code, including cover groups, complies with all provisions/elements of any system verification standard/specification (e.g., the SystemVerilog standard/specification, including cover group components of the standard/specification) to ensure the verification code compiles without modification by a verification engineer, which reduces the development cycle of a verification plan. Further, by utilizing a hardware design for the DUT, the verification/test system 122 can suggest a cover group that corresponds to an input/variable in the hardware design. In this fashion, the verification system maintains consistency and linkage between the hardware design and cover groups. As will be described in greater detail below, the verification system can maintain additional linkages between (1) each of the requirements for a module of a DUT, the set of features to fulfill each requirement in the set of features, and/or the set of sub-features and (2) cover groups by providing an interface for inputting each of these pieces of information. Thus, upon receiving verification results associated with each cover group, the verification system can determine success criteria per module, per requirement, per feature, and/or per sub-feature. Additional details of the verification system will be described below.

Figure 1:
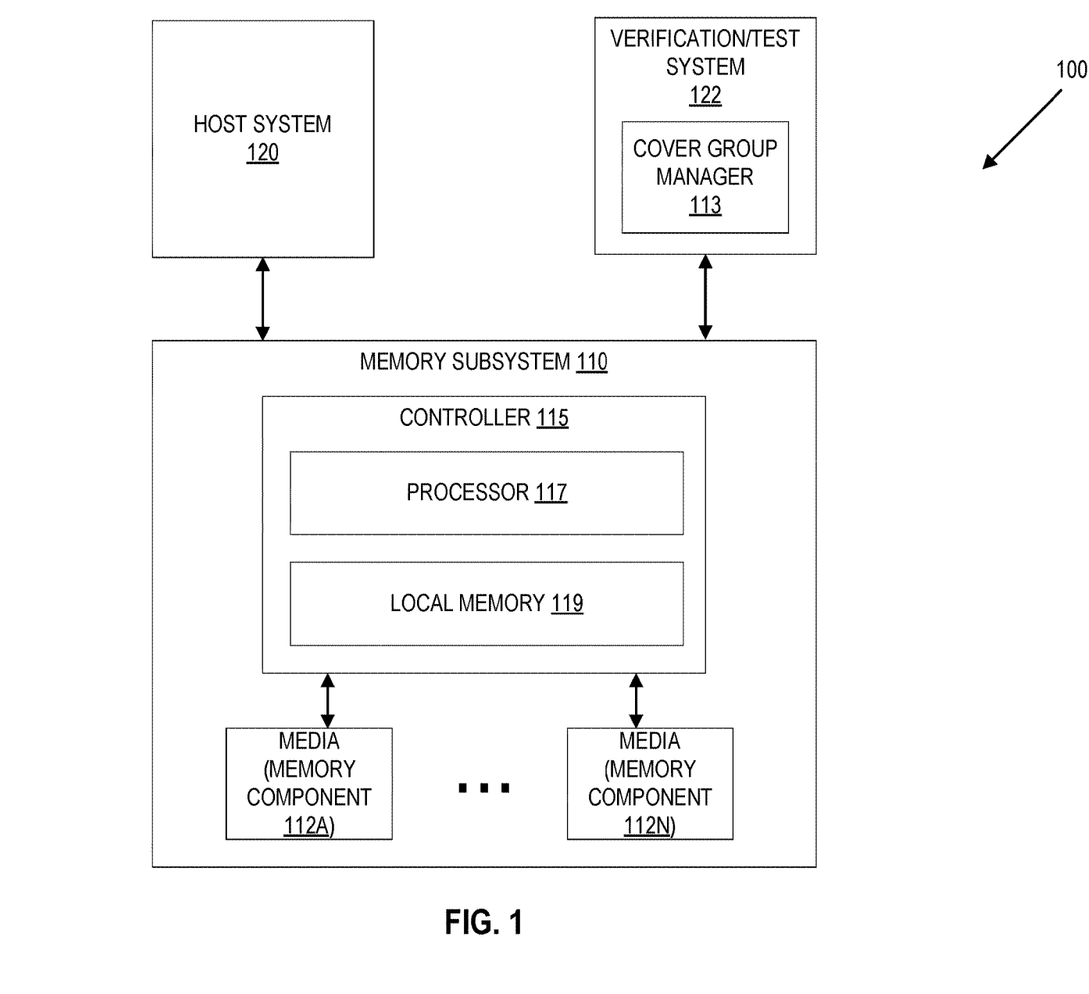
FIG. 1 illustrates an example computing environment that includes a memory subsystem in accordance with some embodiments of the present disclosure.

FIG. 1 illustrates an example verification/testing environment 100 that includes a memory subsystem 110 in accordance with some embodiments of the present disclosure. The memory subsystem 110 can include media, such as memory components 112A to 112N. The memory components 112A to 112N can be volatile memory components, non-volatile memory components, or a combination of such. In some embodiments, the memory subsystem is a storage system. An example of a storage system is an SSD. In some embodiments, the memory subsystem 110 is a hybrid memory/storage subsystem. In general, the verification/testing environment 100 can include a host system 120 that uses the memory subsystem 110. For example, the host system 120 can write data to the memory subsystem 110 and read data from the memory subsystem 110.

The host system 120 can be a computing device such as a desktop computer, laptop computer, network server, mobile device, or such computing device that includes a memory and a processing device. The host system 120 can include or be coupled to the memory subsystem 110 so that the host system 120 can read data from or write data to the memory subsystem 110. The host system 120 can be coupled to the memory subsystem 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory subsystem 110. The host system 120 can further utilize an NVM Express (NVMe) interface to access the memory components 112A to 112N when the memory subsystem 110 is coupled with the host system 120 by the PCIe interface. The physical host interface can provide an interface for passing control, address, data, and other signals between the memory subsystem 110 and the host system 120.

The memory components 112A to 112N can include any combination of the different types of non-volatile memory components and/or volatile memory components. An example of non-volatile memory components includes a negative- and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and an MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or another suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory subsystem 110, including handling communications between the memory subsystem 110 and the host system 120. In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the controller 115, in another embodiment of the present disclosure, a memory subsystem 110 may not include a controller 115, and may instead rely upon external control (e.g., provided by an external host, or by a processor or controller separate from the memory subsystem).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory components 112A to 112N.

As shown in FIG. 1, the verification/testing environment 100 includes a verification/test system 122, including a cover group manager 113, for allowing a verification engineer to automatically generate verification code for verifying/testing the performance and capabilities of the memory subsystem 110. In particular, the verification engineer can input into the verification/test system 122 one or more of a set of requirements for a module of the memory subsystem 110, a set of features to fulfill each requirement in the set of requirements, and/or a set of sub-features to fulfill the set of features. The verification engineer can further input into the verification/test system 122 cover group attributes for one or more cover groups that provide coverage for verifying/testing the performance and capabilities of the memory subsystem 110, including verifying/test modules, requirements, features, sub-features, etc. Based on these input details and specifications regarding the syntax of cover groups, the verification/test system 122 can automatically generate verification code to represent the cover groups. Further details with regards to the operations of the verification/test system 122 are described below. Although described in relation to a memory subsystem (e.g., the memory subsystem 110), the verification/test system 122, including the cover group manager 113, can be used in relation to verification/testing of any application specific integrated circuit (ASIC). Accordingly, description of a memory subsystem is for illustrative purposes and does not restrict the application of the verification/test system 122 described herein.

Figure 2:
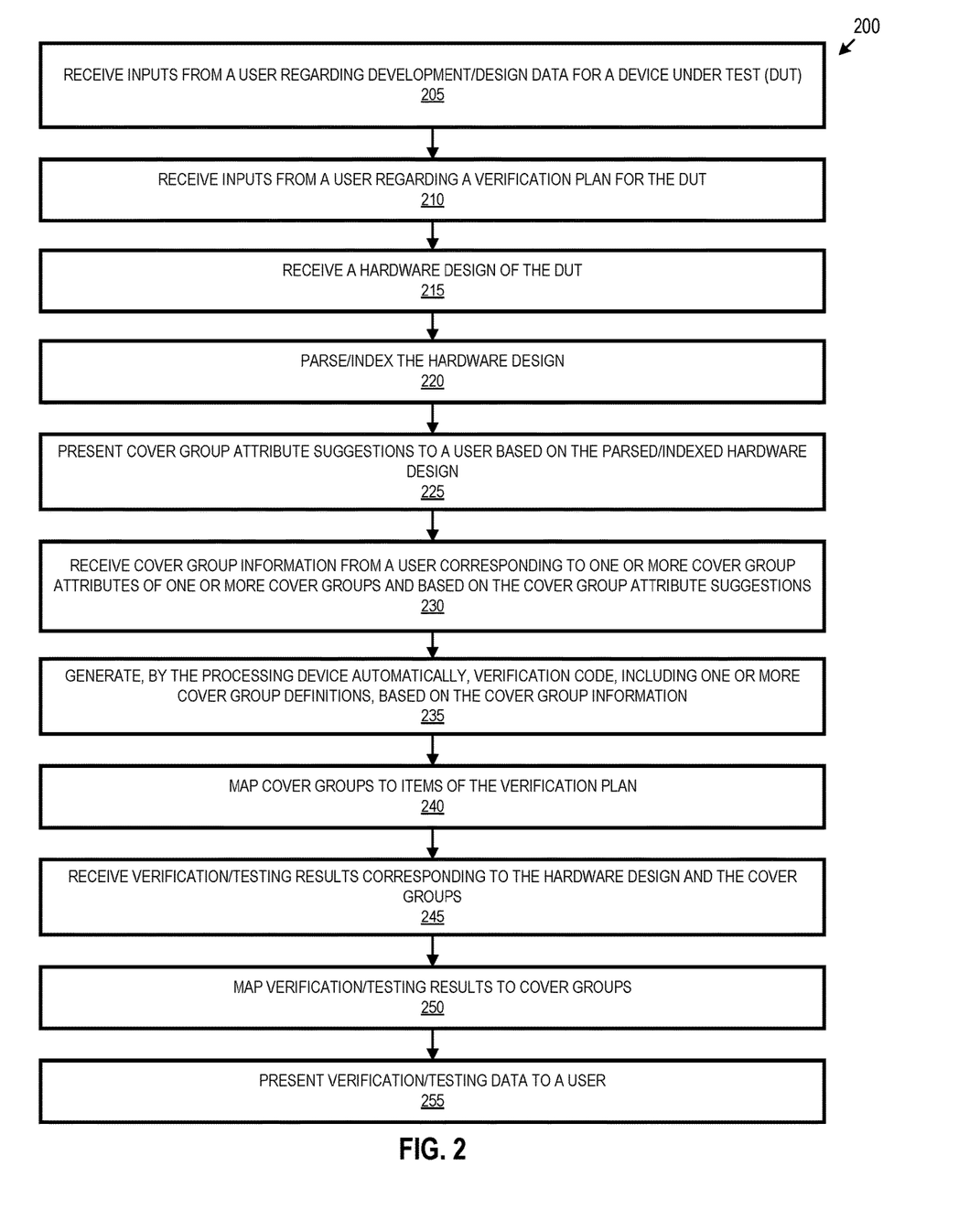
FIG. 2 is a flow diagram of an example method to perform verification and testing of a device under test (DUT), in accordance with some embodiments of the present disclosure.

FIG. 2 is a flow diagram of an example method 200 to perform verification and testing of a device under test (DUT) (e.g., the memory subsystem 110), in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the verification/test system 122, including the cover group manager 113, of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 205, the processing device receives inputs from a user regarding development/design data for a DUT. For example, the processing device can receive a set of requirements for a set of modules of the DUT, a set of features to fulfill each requirement in the set of requirements, and/or a set of sub-features to fulfill the set of features at block 205. In some embodiments, the DUT is a memory subsystem 110 and the set of modules include an Advanced Encryption Standard (AES) module, a Secure Hash Algorithm (SHA) module, a system bus module, a Logical Bus Addressing (LBA) module, a network interface module, and a Direct Memory Access (DMA) module. However, the DUT is not restricted to memory devices and can be any ASIC device.

The processing device can receive inputs from a user (e.g., a verification engineer) at block 205 via a graphical user interface. For example, the processing device can include a graphical user interface presented to the user via a web browser or via a standalone application running on the processing device.

Figure 3:
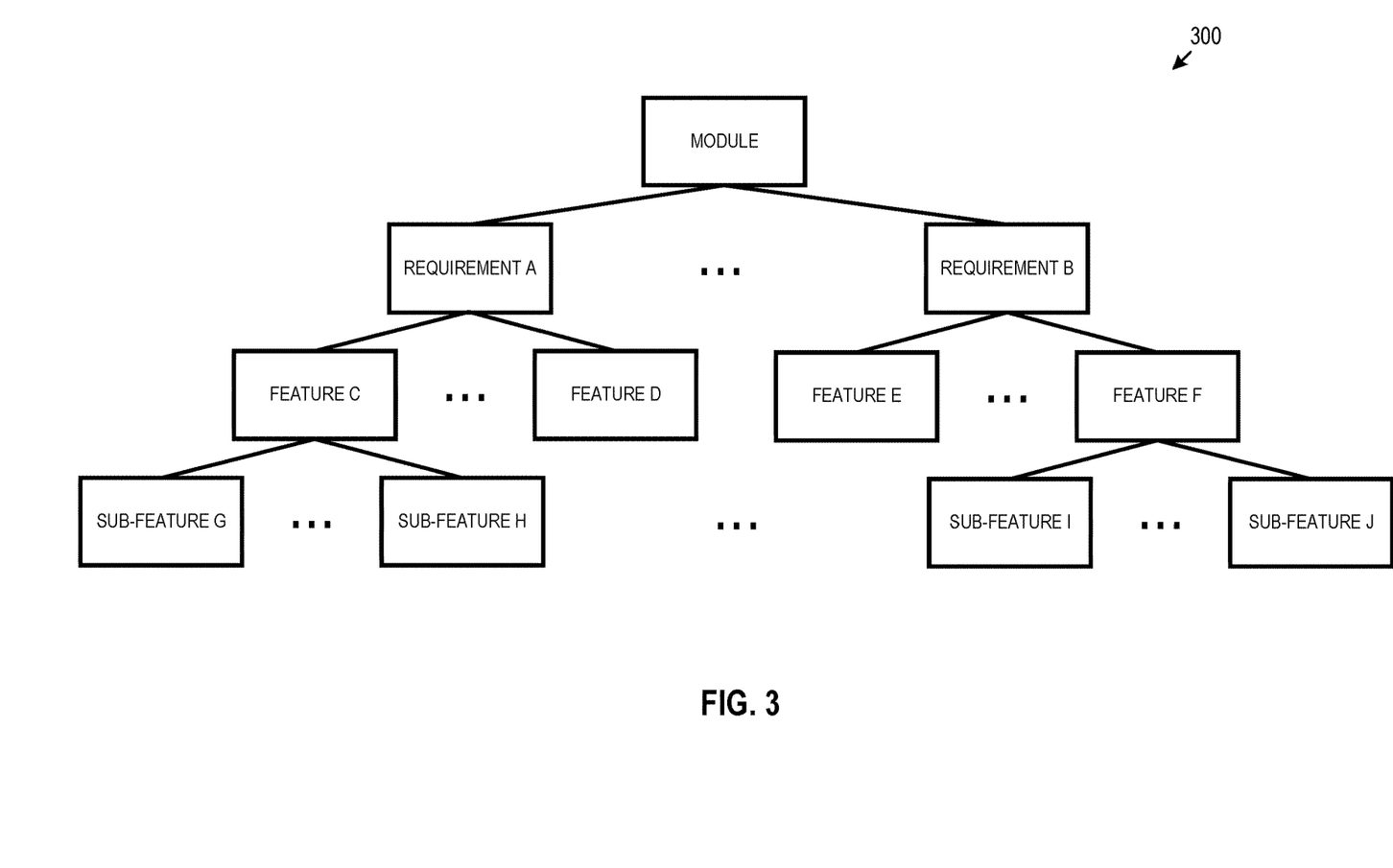
FIG. 3 shows a hierarchical relationship between portions of development/design data for a single module of a DUT, in accordance with some embodiments of the present disclosure.

In some embodiments, the processing device receives multiple levels of development/design data regarding the DUT at block 205. For example, the user of the processing system can input to the processing device, via a graphical user interface, a set of requirements regarding a first module and/or a second module of the DUT at block 205. The user can thereafter input sets of features and/or sub-features for fulfilling those requirements. Accordingly, the processing device can maintain a hierarchical relationship between development/design data for the DUT (e.g., sub-features are linked to features, features are linked to requirements, and requirements are linked to modules). In particular, the processing device can store the multi-level development/design data at block 205 in a database or another data structure, including links between pieces of development/design data. For example, FIG. 3 shows a hierarchical relationship between portions of development/design data 300 for a single module that can be stored/represented in a database or another data structure at block 205. A single DUT can include multiple modules, which are each represented with similar development/design data as the development/design data 300 that is shown in FIG. 3.

Figure 4:
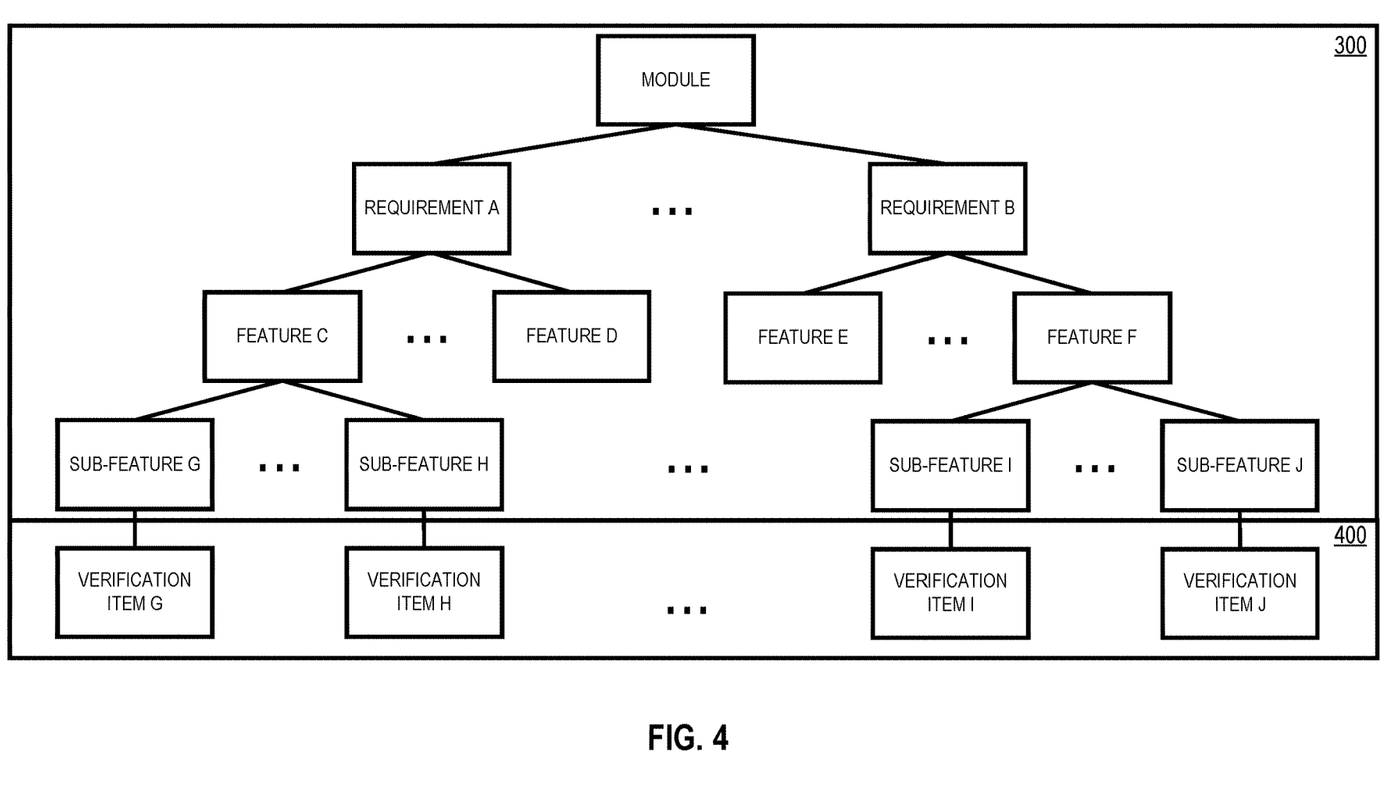
FIG. 4 shows relationships between portions of development/design data of a single module of a DUT and items of the verification plan, in accordance with some embodiments of the present disclosure.

At block 210, the processing device receives inputs from a user regarding a verification plan for the DUT. The processing device can receive inputs from a user (e.g., a verification engineer) at block 210 via a graphical user interface. For example, the processing device can include a graphical user interface presented to the user via a web browser or via a standalone application that is running on the processing device. In some embodiments, the user from block 205 is the same as the user from block 210, while in some embodiments the user from block 205 is different from the user at block 210. For example, the user from block 205 can be a development engineer that designs and implements the DUT while the user from block 210 is a verification/test engineer that verifies/tests the functionally and/or performance of the DUT. The verification plan is a plan for verifying/testing the performance, functionality, and/or capabilities of the DUT. In some embodiments, the verification plan includes one or more items that correspond to sub-features, features, requirements, and/or modules, which were received at block 205. For example, at block 210 the processing device can receive a verification plan that includes an item for each sub-feature in the development/design data received at block 205. The items can include use cases, functions, processes, or other similar items to verify functionality for in the DUT. The processing device can store the verification plan at block 210 in a database or another data structure, including links/mappings between items of the verification plan and portions of the development/design data. For example, FIG. 4 shows relationships between portions of development/design data 300 of a single module and items of the verification plan 400 that can be stored/represented in a database at block 210 (e.g., the same database as used to store the development/design data 300 at block 205). Although shown with a one-to-one relationship between verification items of the verification plan 400 and sub-features of the development/design data 300, in some embodiments, a single item of the verification plan 400 can be mapped to or otherwise associated with multiple sub-features of the development/design data 300.

At block 215, the processing device receives a hardware design for the DUT. For example, the processing device can include a graphical user interface for indicating a location (e.g., a file path or a universal resource locator (URL)) of the hardware design such that the processing device can import files or other data structures representing the hardware design. The hardware design implements the developmental/design data received by the processing device at block 205 and can include any logic and/or instructions for expressing/implementing this developmental/design data. For example, the hardware design can be register-transfer level (RTL) code. In one embodiment, the hardware design includes instantiations of a number of variables representing inputs, wires, or other hardware structures of the DUT. As will be described in greater detail below, these variables (i.e., the names and attributes/characteristic of these variables) can later be accessed by the processing device for suggesting cover group attributes to a user.

At block 220, the processing device parses/indexes the hardware design to produce an indexed hardware design. Parsing/indexing the hardware design provides performant information location and retrieval. For example, the processing device can index the hardware design by variable name and variable value such that suggestions can be provided to users of the verification system when defining cover groups.

Figure 5:
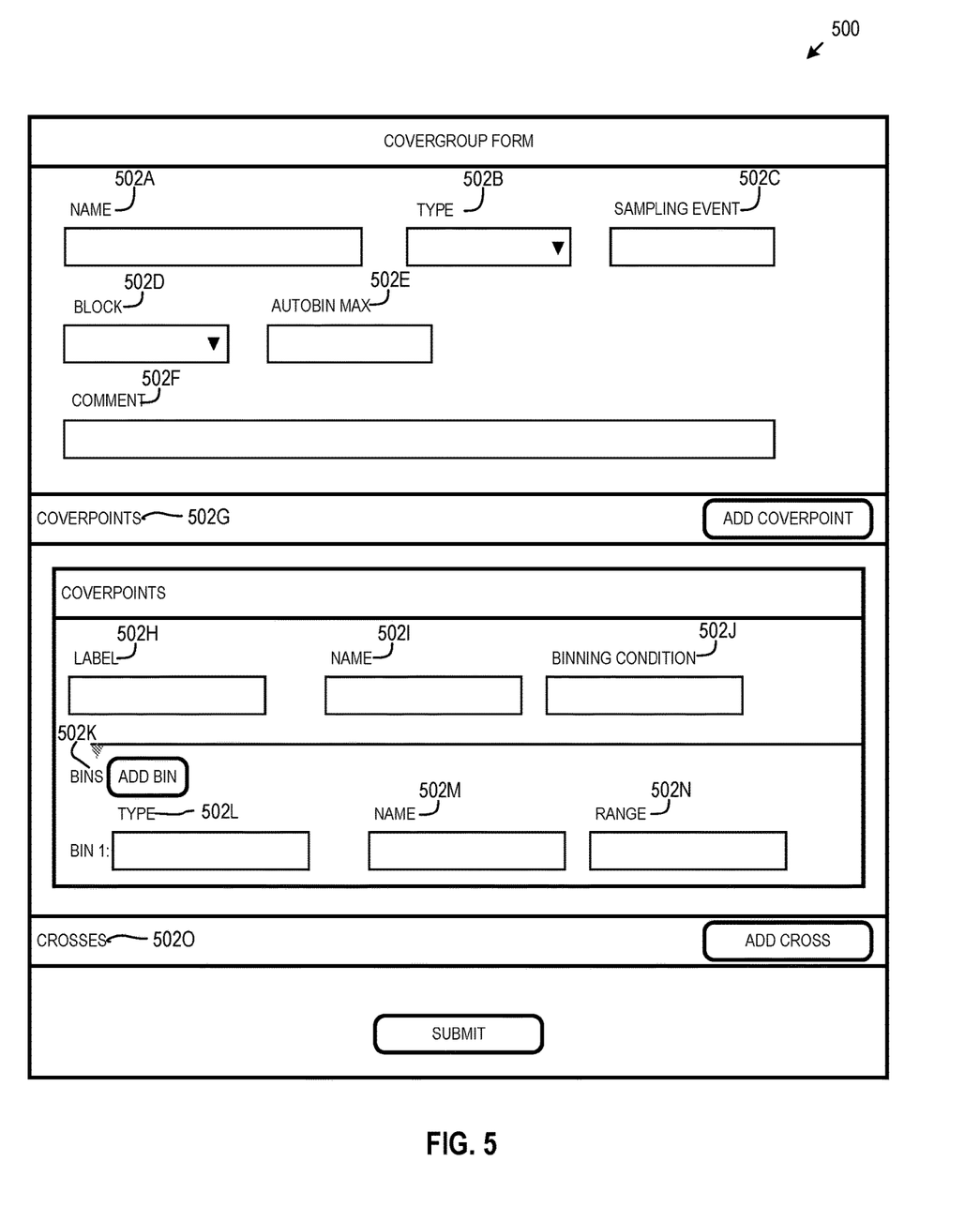
FIG. 5 shows an example cover group graphical user interface for allowing a user to input values for cover group attributes and presenting suggestions to the user regarding one or more cover group attributes, in accordance with some embodiments of the present disclosure.
Figure 6:
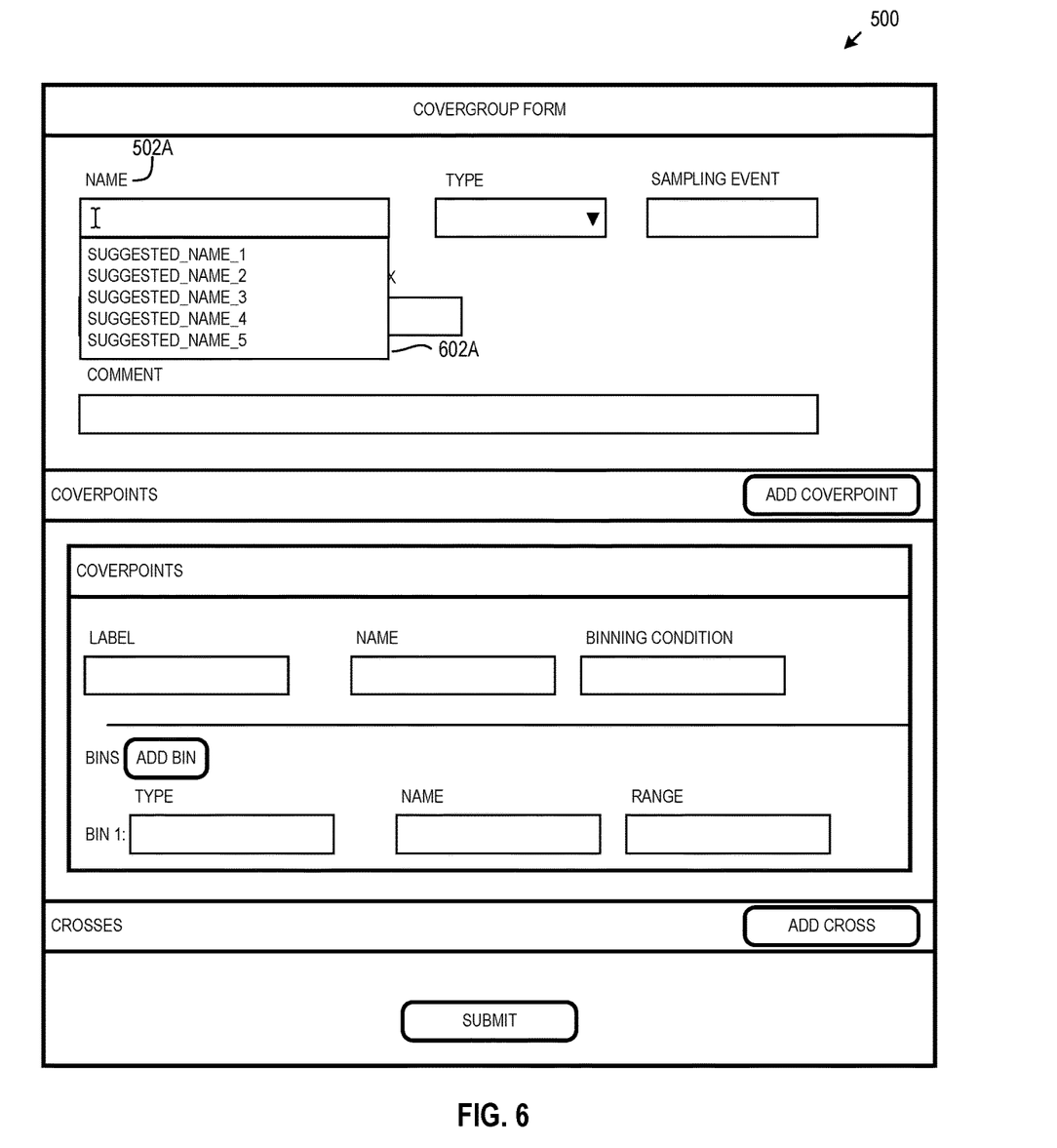
FIG. 6 shows the example cover group graphical user interface with suggestions presented to the user regarding one or more cover group attributes, in accordance with some embodiments of the present disclosure.

At block 225, the processing device presents cover group attribute suggestions, including a cover group name, a cover group type, a sampling event, a block, a bin max, and/or a comment, to a user of the processing device. The cover group attribute suggestions can be based on the parsed/indexed hardware design from block 220. For example, for a cover group name, the processing device can suggest the names of all input wires described/instantiated in the hardware design. FIG. 5 shows an example cover group graphical user interface 500 for allowing a user to input values for cover group attributes 502A-502N and presenting suggestions to the user regarding one or more cover group attributes 502A-502N. As shown in FIG. 6, upon the user selecting a cover group attribute 502 (e.g., cover group attribute 502A, which is a name attribute), suggestions 602 are presented to the user. The user can select one of the suggestions 602 (e.g., select one of the SUGGESTED_NAME_1, SUGGESTED_NAME_2, etc.) or input another value. The suggestions 602 are populated based on the hardware design parsed/indexed at block 220. For example, the suggestions 602 can correspond to variable names in the hardware design. Although shown only in relation to the cover group name attribute, suggestions can be provided in relation to all attributes of a cover group.

At block 230, the processing device receives cover group information from a user corresponding to one or more cover group attributes of one or more cover groups. As shown in FIG. 5, the cover group attributes 502 can include a cover group name 502A, a cover group type 502B, a sampling event 502C, a block 502D, a bin max 502E, a comment 502F, one or more coverpoints 502G, which each can include a label 502H, a name 502I, a binning condition 502J, one or more bins 502K (each with a type 502L, a name 502M, and a range 502N), and/or one or more crosses 502O. In one embodiment, the cover group information received from a user is received in response to or at least based on the suggestions provided by the processing device at block 225. For example, the processing device can suggest a name for a cover group, which corresponds to a variable in the hardware design. In response, the user can select one of these suggested names or input a different name into the processing device.

Figure 7:
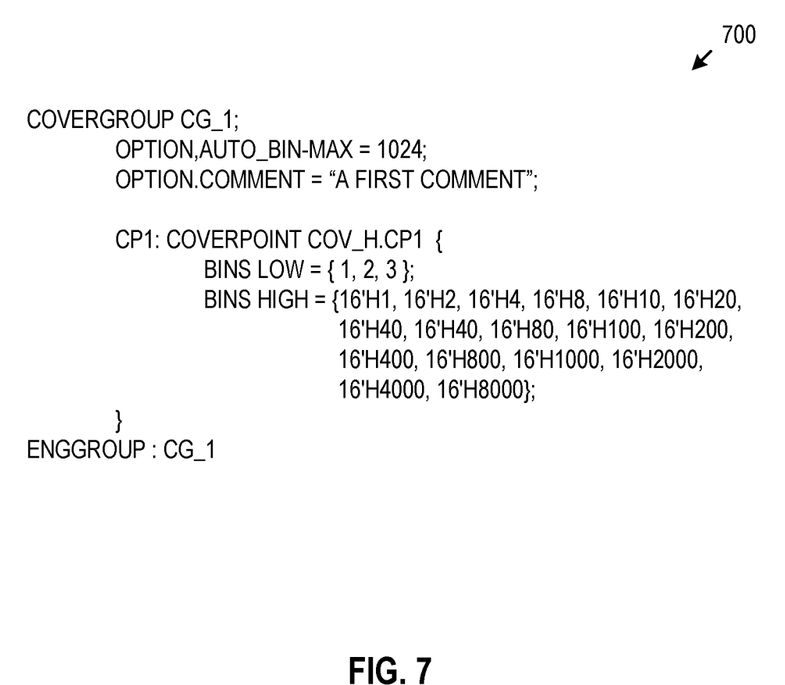
FIG. 7 shows example verification code represented in SystemVerilog that can be automatically generated based on cover group information received from the user, in accordance with some embodiments of the present disclosure.

At block 235, the processing device generates verification code based on the cover group information. For example, the processing device can automatically generate code including or otherwise representing one or more cover group definitions based on the cover group information received at block 230. The generation of verification code representing one or more cover groups is based on one or more specifications that standardize and govern usage and compilation of cover groups, including code syntax necessary for compilation. For example, FIG. 7 shows example verification code 700 represented in SystemVerilog that can be automatically generated based on cover group information received at block 230. The verification code generated at block 235 represents one or more cover groups, which corresponds to one or more items of the verification plan of block 210. Since the verification code, including cover group definitions, are generated according to one or more specifications that standardize and govern usage and compilation of cover groups, compilation of the verification code/cover groups is ensured. Further, since the verification code, including cover groups, are generated automatically based on the cover group information, including cover group attributes, typographical errors while coding cover groups or errors in transposing determined/selected stimuli are avoided. Although shown and described in relation to SystemVerilog, the method 200 can operation in relation to any programming, modeling, or verification language.

Figure 8:
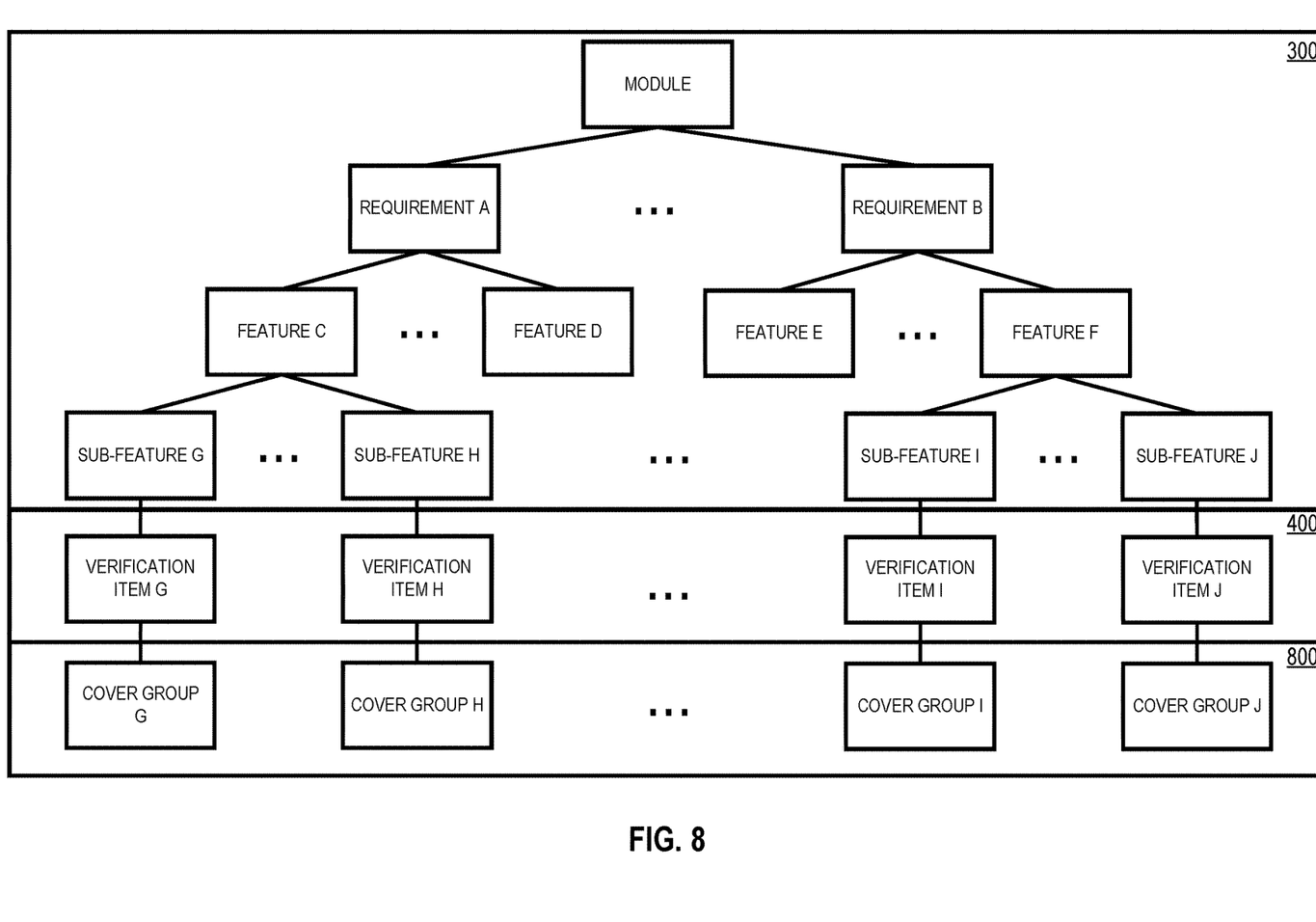
FIG. 8 shows a mapping of cover groups to items of the verification plan, in accordance with some embodiments of the present disclosure.

At block 240, the processing device maps references to each cover group represented in verification code generated at block 235 to corresponding items in the verification plan of block 210. For example, FIG. 8 shows a mapping of cover groups 800 to items of the verification plan 400. Since items of the verification plan 400 are themselves mapped to portions of development/design data 300, the cover groups 800 are themselves indirectly mapped to portions of development/design data 300. The mapping of FIG. 8 can be stored/represented in a database at block 240 (e.g., the same database as used to store the development/design data 300 at block 205 and the verification plan 400 at block 210).

At block 245, the processing device receives verification/testing results for the DUT (e.g., the memory subsystem 110) based on the hardware design and the cover groups represented in the verification code. In particular, the cover groups indicate coverage of stimuli/test patterns for verifying/testing the performance, functionality, and/or capabilities of the DUT. In some embodiments, verification/testing of the DUT based on the cover groups represented in the verification code is performed by the processing device while in other embodiments the verification/testing of the DUT is performed by another device.

Figure 9:
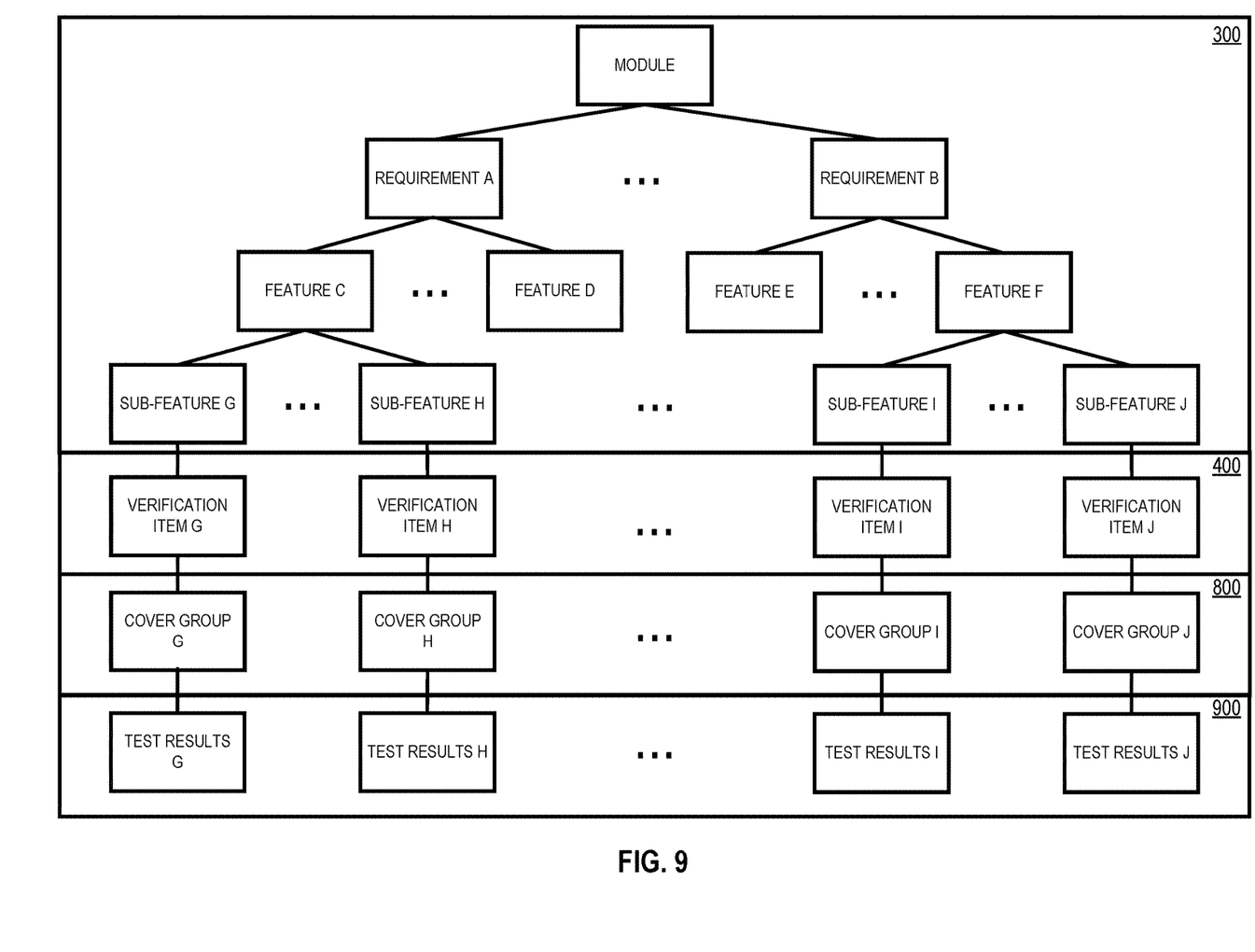
FIG. 9 shows a mapping of verification/testing results to cover groups, in accordance with some embodiments of the present disclosure.

At block 250, the processing device maps the verification/testing results to corresponding cover groups. For example, FIG. 9 shows a mapping of verification/testing results 900 to cover groups 800. Since cover groups 800 are themselves mapped to items of the verification plan and the items of the verification plan are mapped to portions of development/design data 300, verification/testing results 900 are themselves mapped to each of these pieces of data. The mapping of FIG. 9 can be stored/represented in a database at block 250 (e.g., the same database as used to store the development/design data 300 at block 205, the verification plan 400 at block 210, and the cover groups 800 at block 240).

At block 255, the processing device presents verification/testing data to a user (e.g., to a verification engineer) such that the user can query or run other analyses routines on the verification testing data. The verification/testing data can include the verification/testing results along with corresponding cover groups, items of the verification plan, and/or development/design data. Accordingly, a user (e.g., a verification/testing engineer can map verification/testing results to (1) cover groups, (2) items of the verification plan, and/or (3) portions of the development/design data. In this fashion, the user can determine completion criteria relative to each of these elements with respect to the DUT based on the verification/testing results.

As described above, the verification/test system 122 automatically generates verification code representing new cover groups based on cover group attributes directly input into the verification/test system 122. Accordingly, the verification code accurately represents the intent of the verification engineer for the cover groups as typographical and transposition errors are avoided. Further, the automatic generation of verification code, including cover groups, complies with all provisions/elements of any system verification standard/specification (e.g., the SystemVerilog standard/specification, including cover group components of the standard/specification) to ensure the verification code compiles without modification by a verification engineer, which reduces the development cycle of a verification plan. In some embodiments, the verification system can receive a hardware design corresponding to a DUT (e.g., RTL code) such that the verification system can present suggested values for each of the cover group attributes. In this fashion, the verification system maintains consistency and linkage between the hardware design and cover groups. Further, by maintaining additional linkages between (1) each of the requirements for a module of a DUT, the set of features to fulfill each requirement in the set of features, and/or the set of sub-features, (2) cover groups, and (3) verification/testing results, the verification system can present success criteria per module, per requirement, per feature, and/or per sub-feature. Accordingly, a user of the verification/test system 122 is presented with a more robust view of the verification process.

Figure 10:
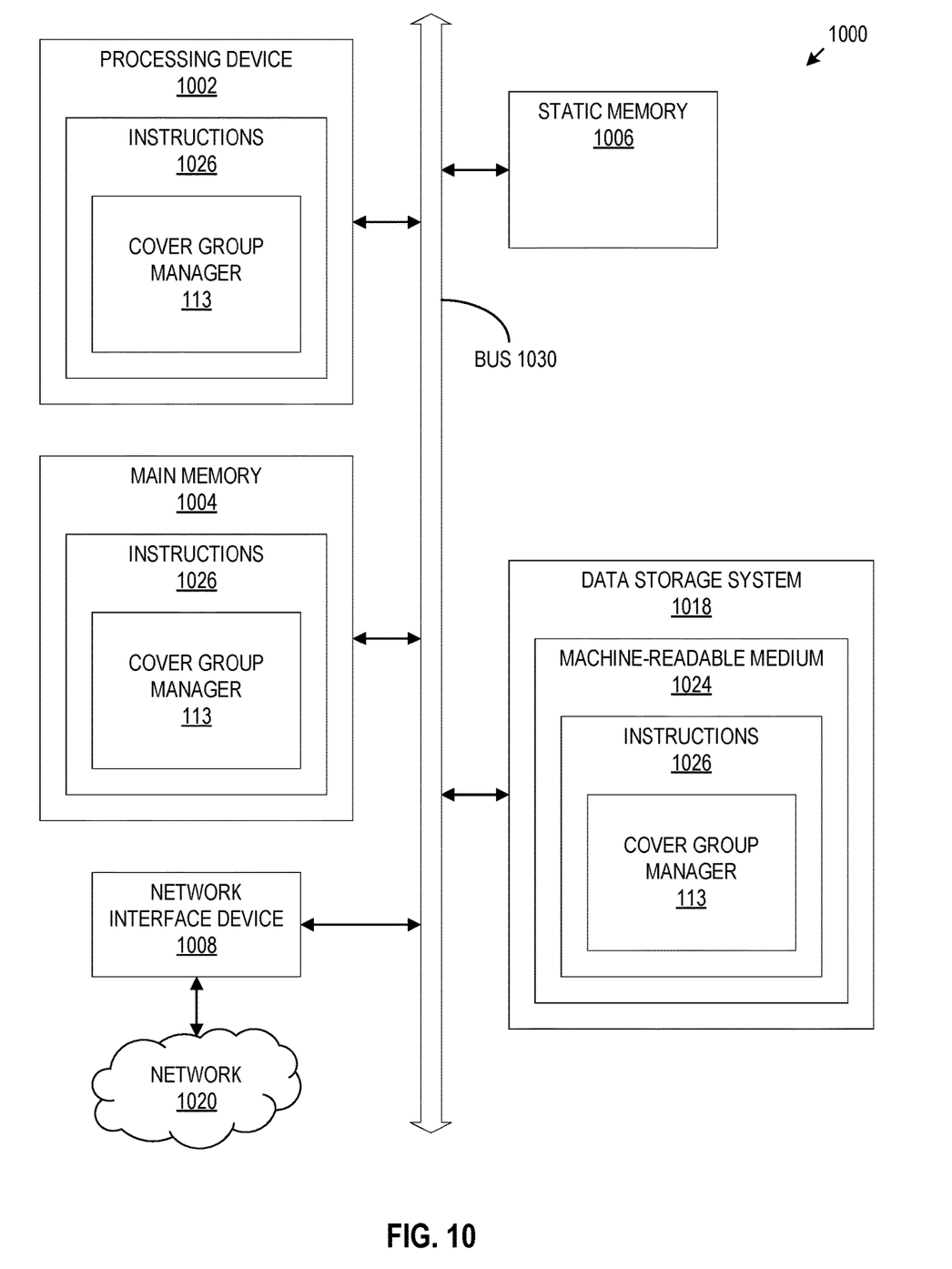
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) or a verification/test system (e.g., the verification/test system 122 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the cover group manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory subsystem 110 of FIG. 1.

In one embodiment, the instructions 1026 include instructions to implement functionality corresponding to a cover group manager (e.g., the cover group manager 113 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. For example, a computer system or other data processing system, such as the controller 115, may carry out the computer-implemented method 200 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
receiving, by a processing device, inputs from a user regarding a hardware design for a device under test (DUT);
presenting, by the processing device, cover group attribute suggestions to the user based on the hardware design;
receiving, by the processing device, cover group information from the user corresponding to one or more cover group attributes of one or more cover groups based on the cover group attribute suggestions; and
generating automatically, by the processing device, verification code, including one or more cover group definitions, based on the cover group information;
receiving, by the processing device, inputs from the user regarding a verification plan for the DUT; and
mapping, by the processing device, each of the one or more cover groups to items of the verification plan, wherein the items of the verification plan are mapped to a portion of the hardware design, and wherein the mapping links an item of the verification plan, one or more cover group, and the hardware design.

2. The method of claim 1, further comprising:
receiving, by the processing device, inputs from the user regarding development/design data for the DUT.

3. The method of claim 2, further comprising:
receiving, by the processing device, verification/testing results corresponding to the hardware design and the one or more cover groups; and
mapping, by the processing device, portions of the verification/testing results to separate cover groups in the one or more cover groups.

4. The method of claim 3, further comprising:
presenting, by the processing device, verification/testing data, including the verification/testing results, to the user,
wherein the presentation indicates relationships between the verification/testing results, the one or more cover groups, the verification plan, and the development/design data.

5. The method of claim 1, wherein the generation of the verification code is based on and in conformance with a specification for cover groups.

6. A non-transitory computer-readable storage medium comprising instructions that, when executed by a processing device, cause the processing device to:
receive inputs from a user regarding a hardware design for a device under test (DUT);
present cover group attribute suggestions to the user based on the hardware design;
receive cover group information from the user corresponding to one or more cover group attributes of one or more cover groups based on the cover group attribute suggestions; and
generate verification code automatically, including one or more cover group definitions, based on the cover group information;
receive inputs from the user regarding a verification plan for the DUT; and
map each of the one or more cover groups to items of the verification plan, wherein the items of the verification plan are mapped to a portion of the hardware design.

7. The non-transitory computer-readable medium of claim 6, wherein the processing device is further to:
receive inputs from the user regarding development/design data for the DUT.

8. The non-transitory computer-readable medium of claim 7, wherein the processing device is further to:
receive verification/testing results corresponding to the hardware design and the one or more cover groups; and
map portions of the verification/testing results to separate cover groups in the one or more cover groups.

9. The non-transitory computer-readable medium of claim 8, wherein the processing device is further to:
present verification/testing data, including the verification/testing results, to the user,
wherein the presentation indicates relationships between the verification/testing results, the one or more cover groups, the verification plan, and the development/design data.

10. The non-transitory computer-readable medium of claim 6, wherein the generation of the verification code is based on and in conformance with a specification for cover groups.

11. A system comprising:
a plurality of memory components; and
a processing device, operatively coupled with the plurality of memory components, to:
receive inputs from a user regarding a hardware design for a device under test (DUT);
present cover group attribute suggestions to the user based on the hardware design;
receive cover group information from the user corresponding to one or more cover group attributes of one or more cover groups based on the cover group attribute suggestions; and
generate verification code automatically, including one or more cover group definitions, based on the cover group information
receive inputs from the user regarding a verification plan for the DUT; and
map each of the one or more cover groups to items of the verification plan, wherein the items of the verification plan are mapped to a portion of the hardware design.

12. The system of claim 1, wherein the processing device is further to:
receive inputs from the user regarding development/design data for the DUT.

13. The system of claim 12, wherein the processing device is further to:
receive verification/testing results corresponding to the hardware design and the one or more cover groups; and
map portions of the verification/testing results to separate cover groups in the one or more cover groups.

14. The system of claim 13, wherein the processing device is further to:
present verification/testing data, including the verification/testing results, to the user,
wherein the presentation indicates relationships between the verification/testing results, the one or more cover groups, the verification plan, and the development/design data.

15. The system of claim 11, wherein the generation of the verification code is based on and in conformance with a specification for cover groups.

* * * * *